(12) United States Patent
Thiel et al.

(10) Patent No.: US 12,114,465 B1
(45) Date of Patent: Oct. 8, 2024

(54) CONVERSION OF IMMERSION COOLING SYSTEMS FOR USE WITH SINGLE-PHASE OPERATING FLUIDS

(71) Applicant: Marathon Digital Holdings, Las Vegas, NV (US)

(72) Inventors: Frederick G. Thiel, Dana Point, CA (US); Jimil M. Shah, Wylie, TX (US); Ashu Swami, Tampa, FL (US); Neer Jain, Madhya Pradesh (IN); Chandra Katta, Cupertino, CA (US)

(73) Assignee: Marathon Digital Holdings, Inc., Las Vegas, NV (US)

( * ) Notice: Subject to any disclaimer, the term of this patent is extended or adjusted under 35 U.S.C. 154(b) by 0 days.

(21) Appl. No.: 18/416,572

(22) Filed: Jan. 18, 2024

(30) Foreign Application Priority Data

Jul. 25, 2023 (IN) .............................. 202321050121

(51) Int. Cl.
*B23P 15/26* (2006.01)
*H05K 7/20* (2006.01)

(52) U.S. Cl.
CPC .............. *H05K 7/203* (2013.01); *B23P 15/26* (2013.01); *H05K 7/20318* (2013.01); *H05K 7/20327* (2013.01)

(58) Field of Classification Search
CPC ........ B23P 15/26; F28D 1/0213; H05K 7/203
See application file for complete search history.

(56) References Cited

U.S. PATENT DOCUMENTS 10,206,307 B2 *   2/2019   Lau ........................ H05K 7/203
11,792,956 B1 *  10/2023   Joshua ................... H05K 7/203
                                                                     361/689

FOREIGN PATENT DOCUMENTS

EP             3236726 A1 * 10/2017  ........... H05K 7/1488
WO      WO-2023241824 A1 * 12/2023  ......... H05K 7/20236

* cited by examiner

*Primary Examiner* — Jermie E Cozart
(74) *Attorney, Agent, or Firm* — Fish IP Law, LLP

(57) ABSTRACT

A two-phase or hybrid immersive cooling system is converted to a one-phase immersive cooling system, by (1) modifying a structure of the two-phase immersive cooling system such that a cooled portion of a substitute operating fluid flows into the operating fluid reservoir from a direction other than from above the reservoir, and (2) using a high boiling point composition as the substitute operating fluid. In some embodiments the tube condensers of the two-phase or hybrid immersive cooling system are retained, and in other embodiments at least portions of the regions previously occupied by tube condensers are used for heat exchangers, and optionally fluid pumps. In still other embodiments at least portions of the regions previously occupied by tube condensers are used for hot fluid holding tanks.

16 Claims, 7 Drawing Sheets

CONVERSION OF IMMERSION COOLING SYSTEMS FOR USE WITH SINGLE-PHASE OPERATING FLUIDS

PRIORITY

This application claims benefit and priority of Indian patent application No. 202321050121, filed on Jul. 25, 2023. This and all other referenced extrinsic materials are incorporated herein by reference in their entirety. Where a definition or use of a term in a reference that is incorporated by reference is inconsistent or contrary to the definition of that term provided herein, the definition or use of that term provided herein is deemed to be controlling.

FIELD OF THE INVENTION

The field of the invention is immersion cooling systems.

BACKGROUND

The following description includes information that may be useful in understanding the present invention. It is not an admission that any of the information provided herein is prior art or relevant to the presently claimed invention, or that any publication specifically or implicitly referenced is prior art.

Background of Immersion Cooling

There are basically three types of immersion cooling systems, a two-phase system, a single-phase system, and a hybrid system.

A two-phase system has a reservoir that holds heat generating components and an operating fluid. The operating fluid extracts heat from the heat generating components, and gets converted into a vapor. As the name suggests, the operating fluid stays in both liquid and gaseous forms in equilibrium at a saturation temperature and pressure. The vapor is condensed by a tube or other condenser and then returned to the tank. Heat from the condenser is then rejected at a facility level through a coolant flowing through the condenser.

In single phase immersion cooling, the operating fluid stays substantially in liquid form throughout the operation. The operating fluid extracts heat from the heat generating components, and transfers it to a coolant via a heat exchanger, which the rejects the transferred heat at a facility level through a coolant flowing through the heat exchanger. The heat transfer to the operating fluid can occur via natural convection and/or forced convection. In natural convection the operating fluid utilizes gravity currents for circulation with or without the help of an agitator. In forced convection, a pump is used to circulate the operating fluid within from the reservoir, through the heat exchanger, and back to the reservoir.

In a hybrid system, the operating fluid contains both a low boiling point composition and a high boiling point composition. When sufficiently heated by the heat generating components, the low boiling point composition evaporate, and releases its heat to a condenser, which returns the evaporated vapor to its liquid phase. The low boiling point composition remains in a liquid phase, is cooled by a heat exchanger.

Two-phase and hybrid immersion cooling systems generally use relatively expensive non-flammable, thermally conductive, dielectric, low boiling point fluorochemicals as the operating fluid. One-phase immersion cooling systems generally use a relatively inexpensive operating fluid, either (1) non-flammable, thermally conductive, dielectric, high boiling point fluorochemicals or (2) non-combustible, thermally conductive, dielectric, high boiling point hydrocarbons. In view of the high cost of the operating fluids used in two-phase and hybrid immersion cooling systems, there is a need to convert two-phase and some hybrid immersion systems to one-phase immersion cooling systems. However, it appears that no one has devised how to conveniently accomplish such conversions.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

The recitation of ranges of values herein is merely intended to serve as a shorthand method of referring individually to each separate value falling within the range. Unless otherwise indicated herein, each individual value is incorporated into the specification as if it were individually recited herein, and ranges include their endpoints.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention. Unless a contrary meaning is explicitly stated, all ranges are inclusive of their endpoints, and open-ended ranges are to be interpreted as bounded on the open end by commercially feasible embodiments.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

SUMMARY OF THE INVENTION

The inventive subject matter provides apparatus, systems, and methods in which a two-phase or hybrid immersive cooling system is converted to a one-phase immersive cooling system, by (1) modifying a structure of the two-phase immersive cooling system such that a cooled portion of a substitute operating fluid flows into the operating fluid reservoir from a direction other than from above the reservoir, and (2) using a high boiling point composition as the substitute operating fluid.

To simplify the description, whatever system is being modified is referred to herein as a pre-modification immersive cooling system, or simply a pre-modification system. Although the apparatus, systems, and methods described herein can be utilized with any suitable heat generating components, specific examples are given with respect to pre-modification immersive cooling systems where the heat generating components include crypto miners or other electronics.

Contemplated below are three sets of strategies for converting a two-phase or hybrid immersive cooling system to a one-phase immersive cooling system. Although not strictly necessary, each of these contemplated conversion strategies optionally removes the bellows.

In a first set of strategies, barriers are positioned in the reservoir such that at least some of the substitute operating fluid flows past the barriers to contact the condensers that had been used to condense vapor evaporated from a low boiling point operating fluid. The barriers are preferably sized and positioned such that hot operating fluid passes over the tops or past other portions of the barriers, cooled by the condensers, and then pumped back into the reservoir. In some contemplated embodiments, the cooled operating fluid is pumped into a bottom 30% of the reservoir, which can include a distribution network at or near the bottom of the reservoir. Alternatively, hot operating fluid passes can pass over the tops or past other a portions of the barriers, is cooled by the condensers, and then flows back into the reservoir entirely by convective forces. An amount of substitute operating fluid can be reduced by raising the heat generating components.

In second set of strategies, some or all of the condensers that had been used to condense vapor evaporated from a low boiling point operating fluid are removed, and brazed plate heat exchanger or other heat exchangers are positioned in the regions previously occupied by the removed condensers or portion of the condensers. The heat exchangers cool the substitute operating fluid passing through them, and the pump are used to circulate substitute operating fluid from the reservoir, through the heat exchangers, and back into the reservoir. As with the first set of strategies, the cooled operating fluid is advantageously pumped into a bottom 30% of the reservoir, which can include a distribution network at or near the bottom of the reservoir. In some embodiments the pumps can also be positioned in the regions previously occupied by the removed condensers or portions of condensers.

In a third set of strategies some or all of the condensers that had been used to condense vapor evaporated from a low boiling point operating fluid are removed, and some or all of the regions previously occupied by the removed condensers or portions of condensers are used as hot fluid holding tanks. Heat exchangers, and pumps configured to circulate substitute operating fluid through the heat exchangers, are positioned outside the previously occupied regions.

Various objects, features, aspects and advantages of the inventive subject matter will become more apparent from the following detailed description of preferred embodiments, along with the accompanying drawing figures in which like numerals represent like components.

DETAILED DESCRIPTION

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

Figure 1:
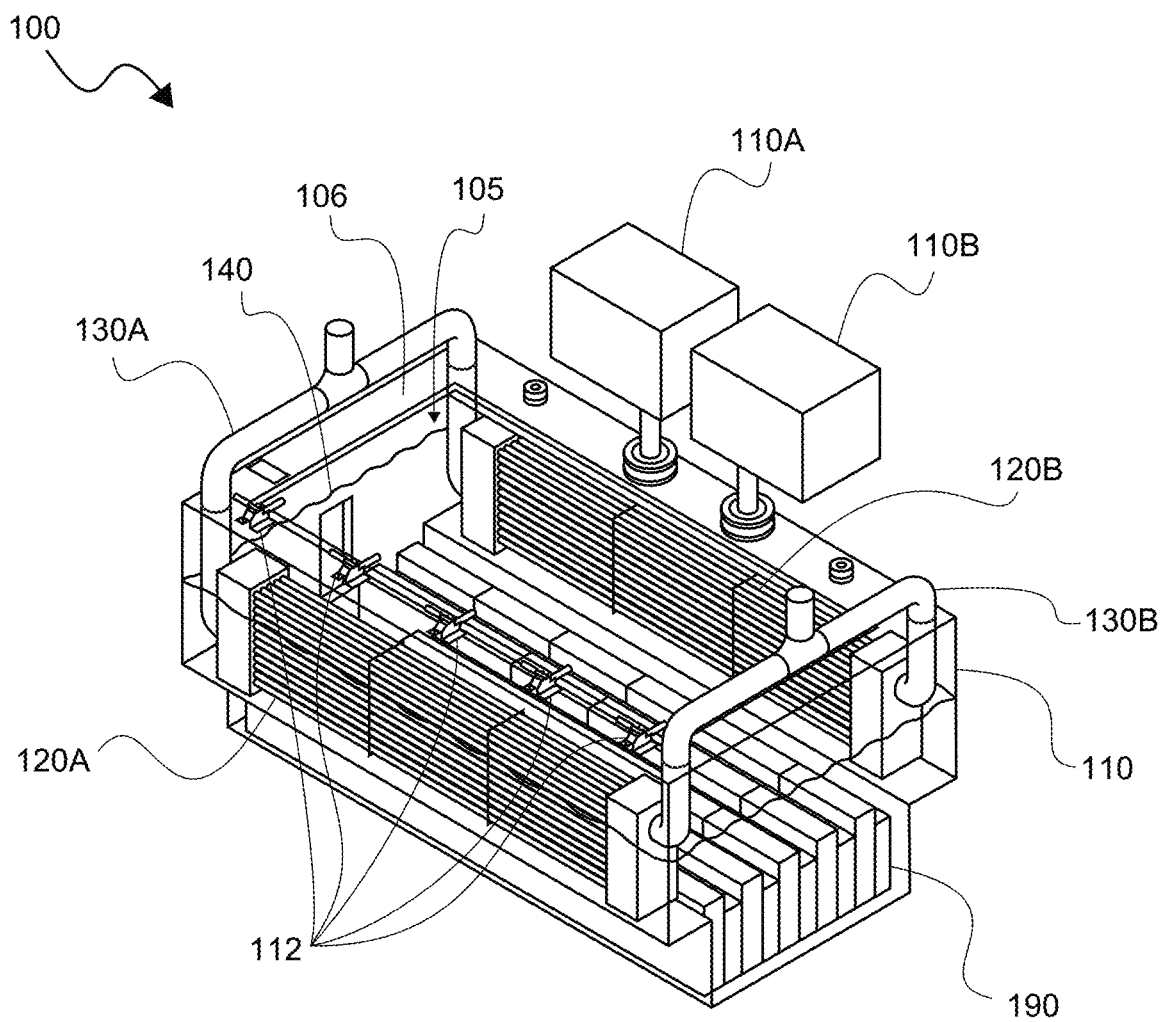
FIG. 1 is a perspective view of a prior art two-phase immersion cooling system, used to provide cooling to multiple crypto miners

In FIG. 1, a prior art two-phase immersion cooling system 100 is used to provide cooling to multiple crypto miners 190. Cooling system 100 generally includes a reservoir 105 bounded by walls 106, bellows 110A, 110B, tube condensers 120A, 120B, and coolant lines 130A, 130B that provide a flow of coolant to the tube condensers 120A, 120B. Line 140 depicts a level of a low boiling point operating fluid within reservoir 105. Multiple hardware pieces 112 are used to attach a top (not shown) to the reservoir. These hardware pieces 112 and the top (not shown) are optionally removed from the one-phase cooling systems of FIGS. 2 and 4-7.

Figure 2:
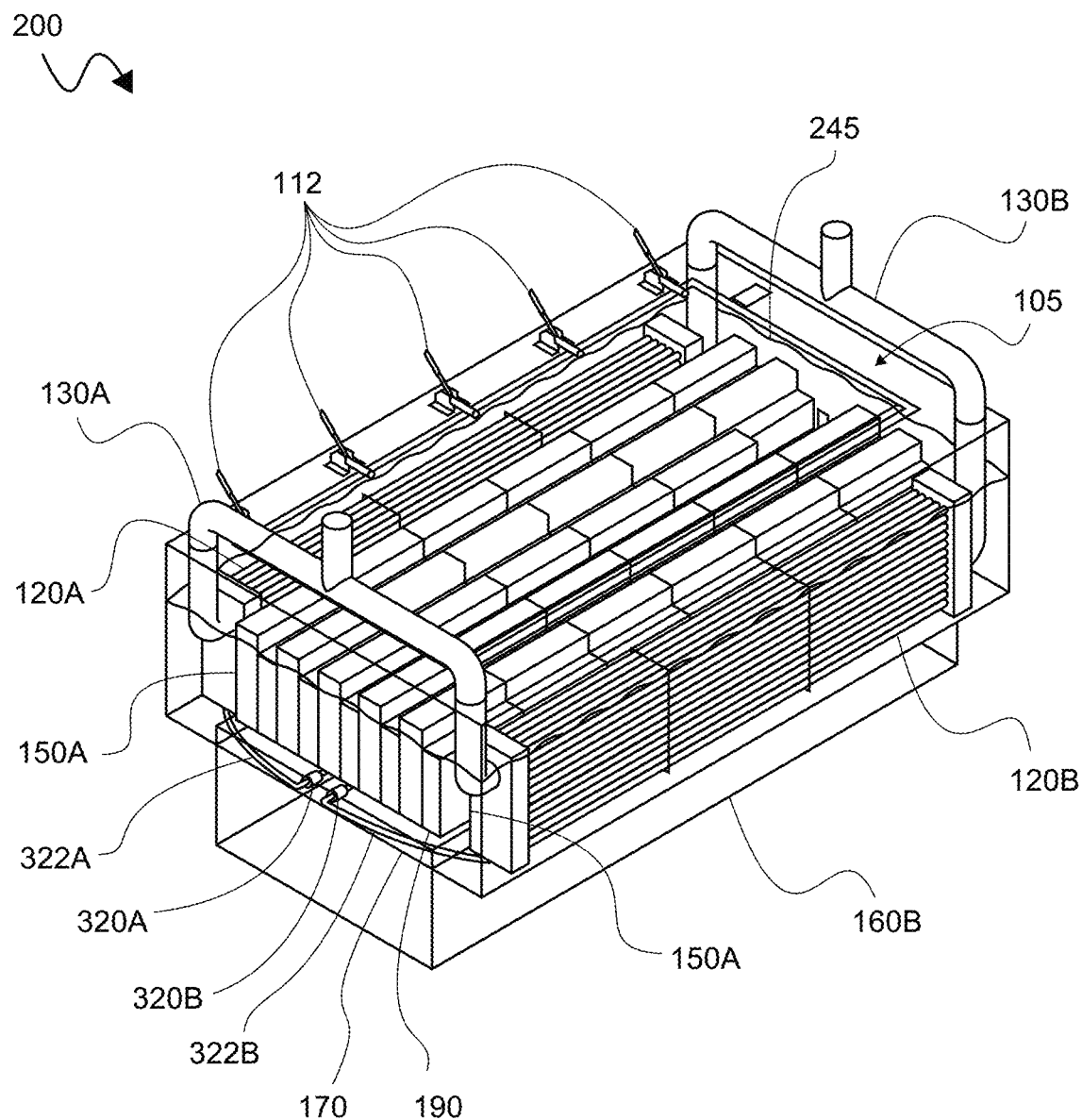
FIG. 2 is a perspective view of a modified immersion cooling system, where the immersion cooling system of FIG. 1 has been modified by removal of the bellows, installation of barriers, and raising of the crypto miners.

In FIG. 2, a one-phase cooling system 200 is modified from the prior art two-phase immersion cooling system 100 by installation of barriers 150A, 150B. Line 245 depicts a level of a high boiling point operating fluid with reservoir 105. The crypto miners 190 are optionally raised to reduce the volume of operating fluid required. In operation, the flows over, through or otherwise past the barriers 150A, 150B to come in contact with the tube condensers 120A, 120B.

Figure 3:
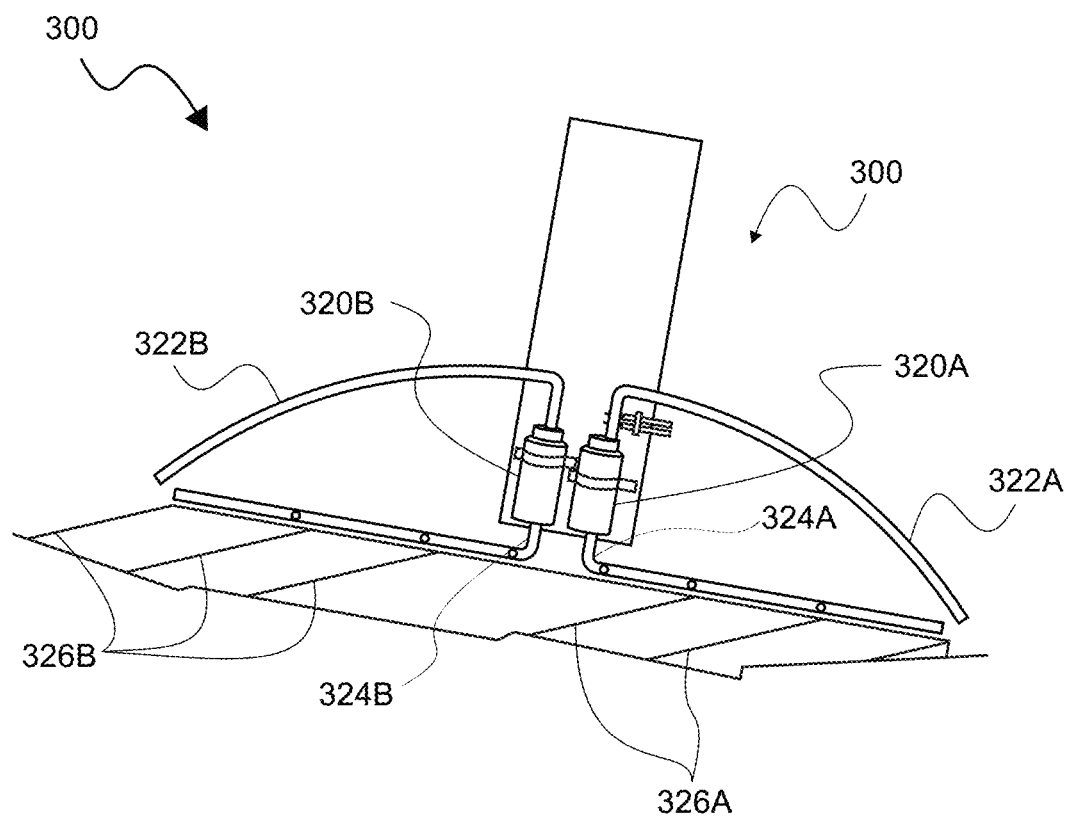
FIG. 3 is a cutaway of a perspective view of a fluid distribution system.

Optional pump 320A and associated tubing 322A, 324A, or other fluid passageways carry operating fluid that has been cooled by flowing past tube condenser 120A into a lower portion of the reservoir 105 or optional distribution system channels 326A (described in detail in FIG. 3). Optional pumps 320B and associated tubing 322B, 324B, or other fluid passageways carry operating fluid that has been cooled by flowing past tube condenser 120B into a lower portion of the reservoir 105 or optional distribution system channels 326A (described in detail in FIG. 3).

As used herein the lower portion of the reservoir 105 comprises the bottom 30% of the reservoir, more preferably the bottom 20% of the reservoir, and still more preferably the bottom 10% of the reservoir, all as measured vertically from the lowest portion of the reservoir to the highest point of the reservoir 105.

In FIG. 3, a fluid distribution system 300 comprises pump 320A fluidly coupled to pump fluid from input tubing 322A to output tubing 324A and then to distribution channels 326A, and pump 320B fluidly coupled to pump fluid from input tubing 322B to output tubing 324B and then to distribution channels 326B. Pump 320A and pump 320B are affixed to support 330.

Figure 4:
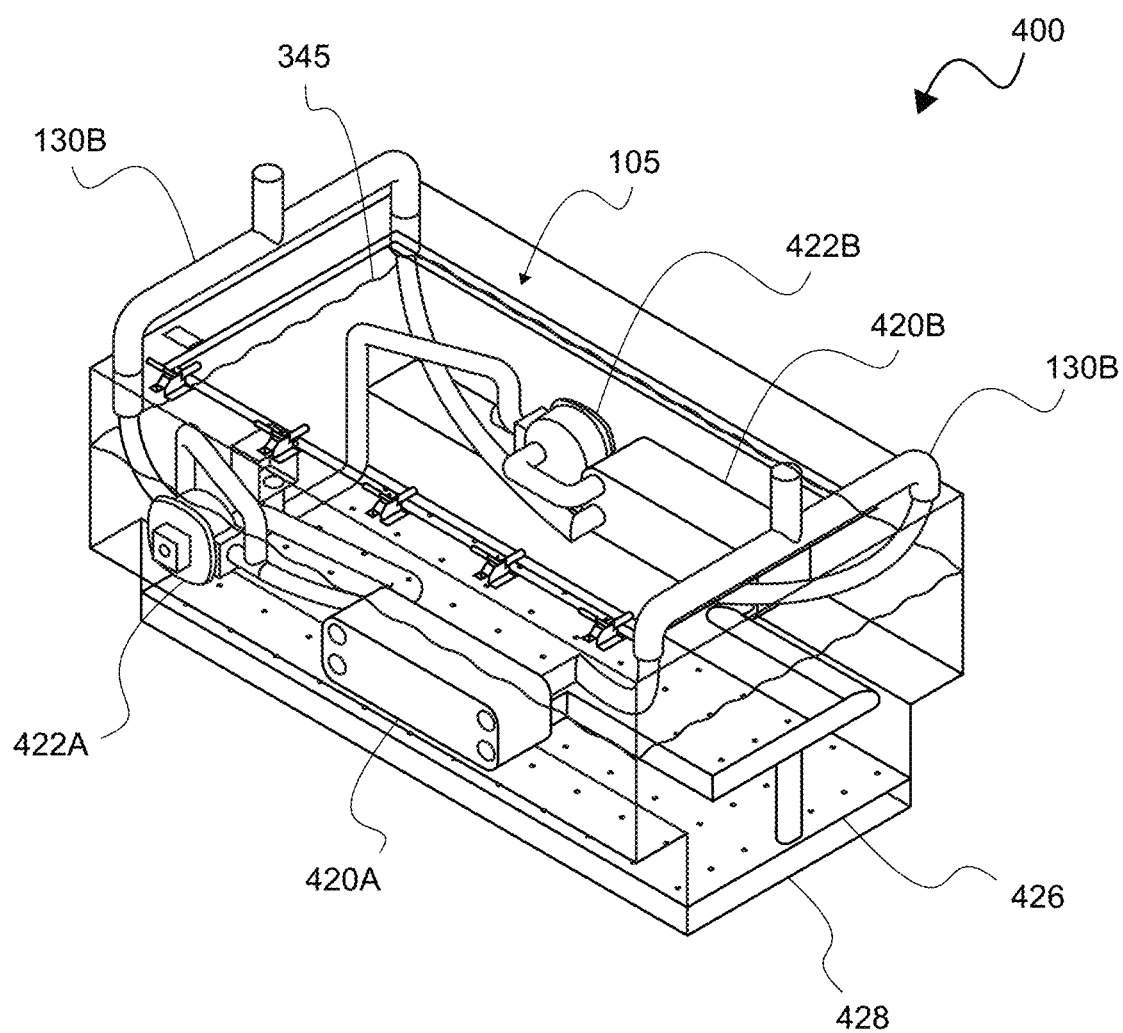
FIG. 4 is a perspective view of a modified immersion cooling system, where the immersion cooling system of FIG. 1 has been modified by removal of the bellows, removal of the tube condensers, installation of heat exchangers and pumps in the region previously occupied by the tube condensers, and a fluid distribution system using fluid channels. The crypto minors are omitted for sake of clarity, but should be understood to be included as positioned in FIG. 1.
Figure 5:
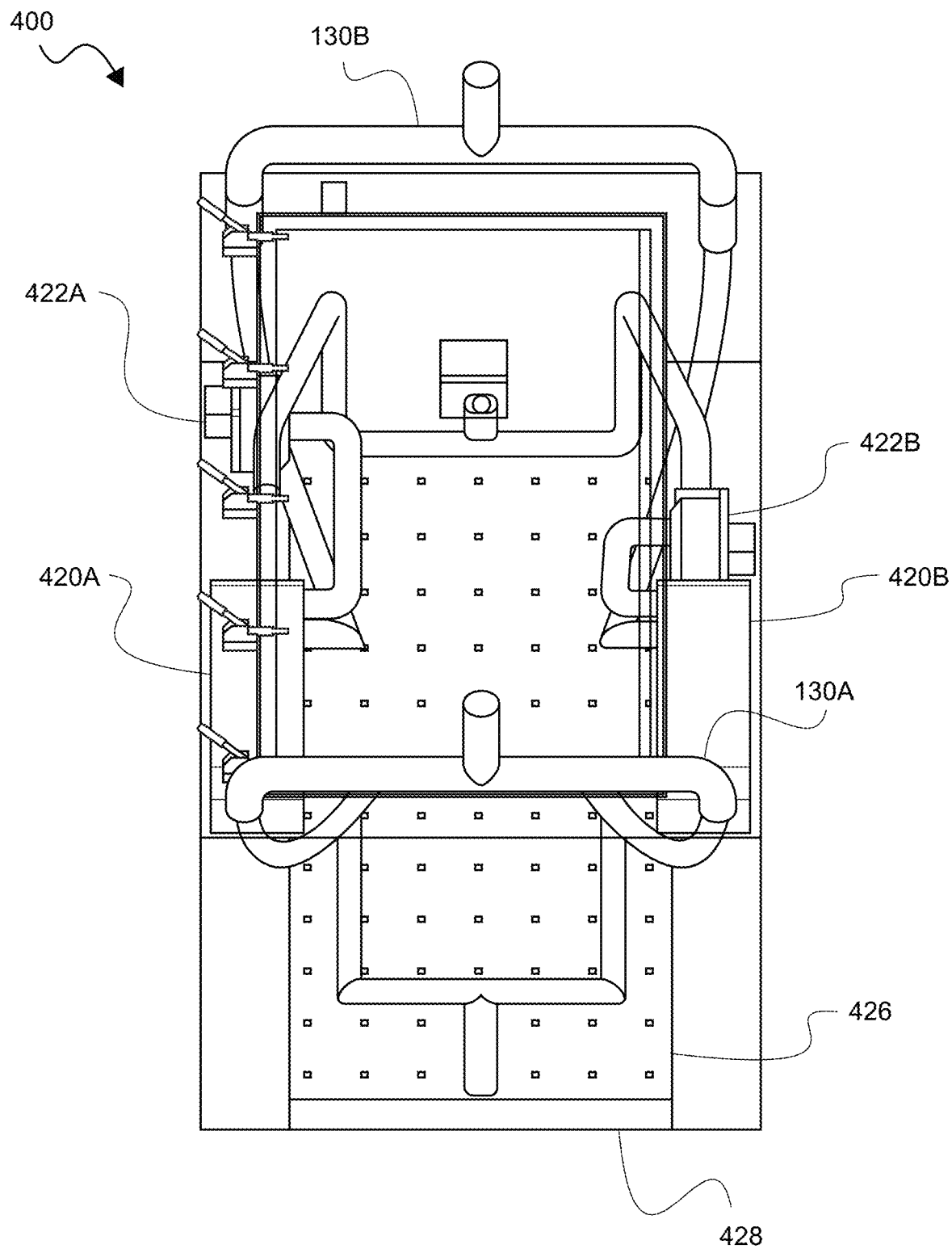
FIG. 5 is a different perspective view of the modified immersion cooling system of FIG. 4.

In FIGS. 4 and 5, a one-phase cooling system 400 is modified from the prior art two-phase immersion cooling system 100 by removal of the bellows, removal of the tube condensers 120A, 120B, installation of heat exchanger 420A and pump 422A in the region previously occupied by the tube condenser 120A, and installation of heat exchanger 420B and pump 422B in the region previously occupied by the tube condenser 120B. Line 345 depicts a level of a high boiling point operating fluid with reservoir 105. The crypto minors 190 are omitted for sake of clarity, but should be understood to be included as positioned in FIG. 1. Operating fluid cooled by the heat exchangers 420A, 420B can be returned to a lower level of the reservoir 105 by being pumped into a space between a perforated plate 426 and the bottom 428 of the reservoir.

Figure 6:
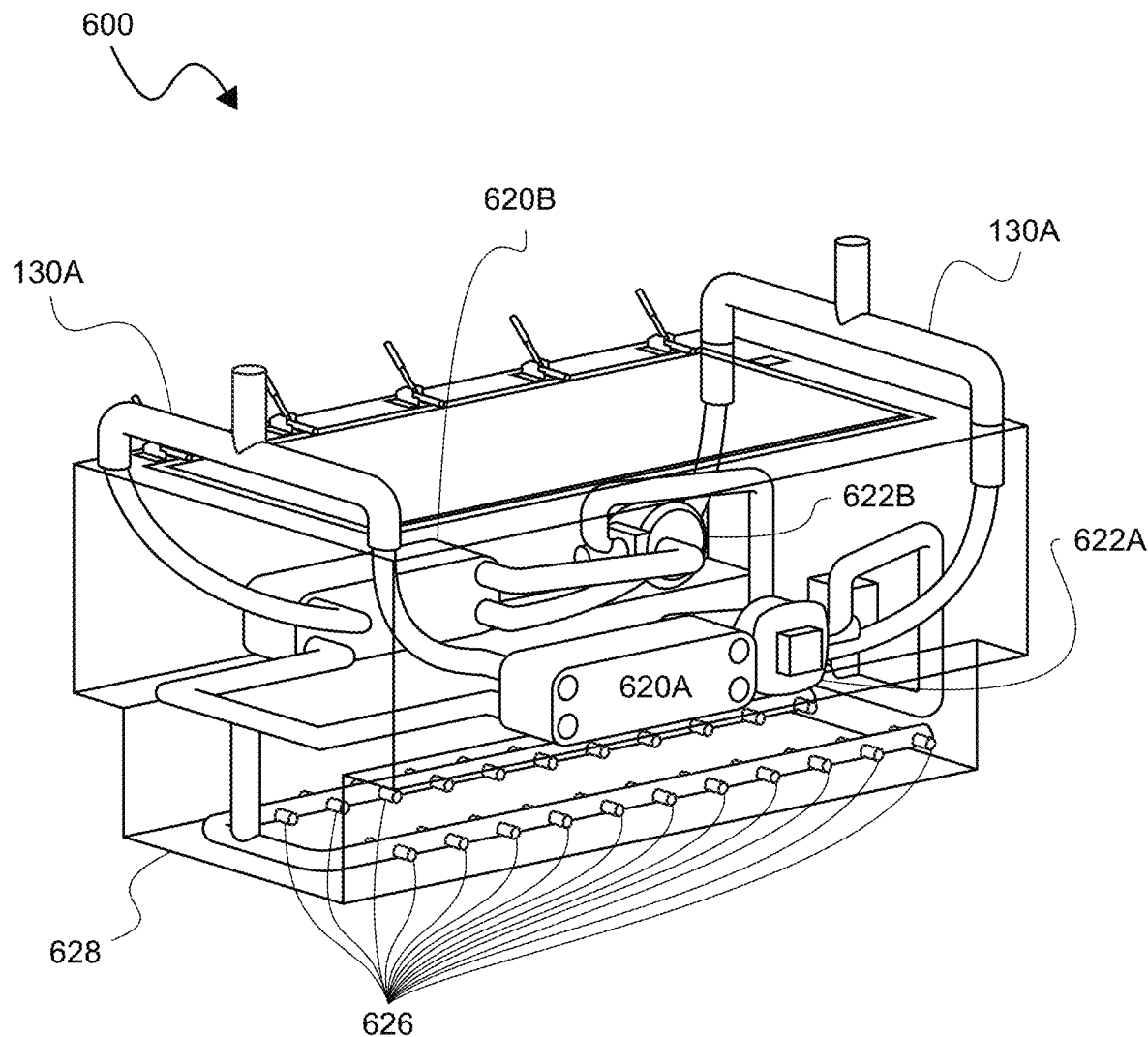
FIG. 6 is a perspective view of a modified immersion cooling system, similar to FIG. 4 except that the different distribution system uses side channels.

In FIG. 6 a one-phase cooling system 600 is modified from the prior art two-phase immersion cooling system 100 by removal of the bellows, removal of the tube condensers 120A, 120B, installation of heat exchanger 620A and pump 622A in the region previously occupied by the tube condenser 120A, and installation of heat exchanger 620B and pump 622B in the region previously occupied by the tube condenser 120B. Line 645 depicts a level of a high boiling point operating fluid with reservoir 105. The crypto minors 190 are omitted for sake of clarity, but should be understood to be included as positioned in FIG. 1. Operating fluid cooled by the heat exchangers 620A, 620B can be returned to a lower level of the reservoir 105 by being pumped out of side channels 626 positioned above bottom 628 of the reservoir.

Figure 7:
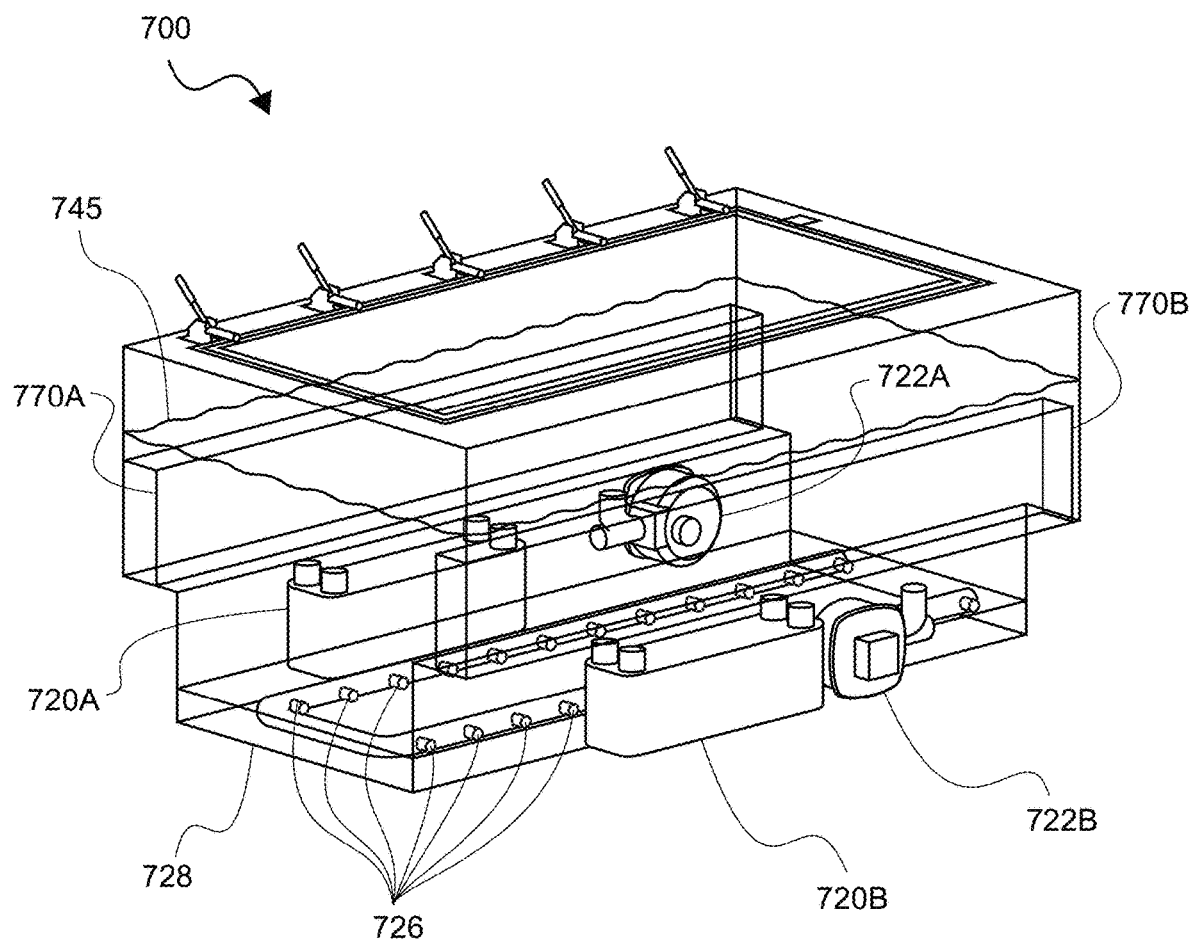
FIG. 7 is a perspective view of a modified immersion cooling system, where the immersion cooling system of FIG. 1 has been modified by removal of the bellows, removal of the tube condensers, installation of hot fluid holding tanks in the region previously occupied by the tube condensers, installation of heat exchangers and pumps, and a fluid distribution system using fluid channels. The crypto minors are again omitted for sake of clarity, but should be understood to be included as positioned in FIG. 1.

In FIG. 7 a one-phase cooling system 700 is modified from the prior art two-phase immersion cooling system 100 by removal of the bellows, removal of the tube condensers 120A, 120B, installation of hot fluid holding tanks 770A, 770B in at least portions of the regions previously occupied by the tube condensers 120A, 120B, respectively, and installation of heat exchangers 720A, 720B and associated pumps 722A, 722B. Fluid level line 745 is at or just above the tops of hot fluid holding tanks 770A, 770B. Operating fluid cooled by the heat exchangers 720A, 720B can be returned to a lower level of the reservoir 105 by being pumped out of side channels 726 positioned above bottom 728 of the reservoir.

As used herein, a high boiling point operating fluid has at least one component with a lowest boiling point of at least 55° C., and in various different contemplated embodiments, at least one component with a lowest boiling point of at least 61° C., at least 75° C., at least 100° C., at least 150° C., or at least 180° C. Exemplary high boiling point (single-phase fluids) include Fluorochemicals like 3M FC 40 (B.P. 165/170C), 3M FC 3283 (B.P. 128C) and Hydrocarbon oils like Shell GTL S3X and S5X, PAOs by Chevron, ExxonMobil, PAO blends like Engineered Fluids EC 100™, GRC's Electrosafe™, Submer's Smart Coolant™, Lubrizol's Compuzol™, Esters, synthetic esters, silicon oils, etc.

Exemplary low boiling point (two phase) operating fluids include 3M FC 72 (B.P. 56C), 3M FC 3284 (B.P. 49C), Solvay Galden HT™ 55 (B.P. 55C), 3M Novec 7000™ (B.P. 34C), 3M Novec 7100™ (B.P. 61C), Novec 649™ (B.P. 49C) and chemistries such as PFCs, HFEs, FKs, HFOs, etc.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A method of converting a pre-modification immersive cooling system to a post-modification immersive cooling system, the pre-modification immersive cooling system configured to flow a cooled portion of an operating fluid into a reservoir from above the reservoir, the method comprising:
   modifying a structure of the pre-modification immersive cooling system such that a cooled portion of a substitute operating fluid flows into the reservoir from a direction other than above the reservoir; and
   using a high boiling point operating fluid as the substitute operating fluid.

2. The method of claim 1 wherein the pre-modification immersive cooling system has a bellows, and, wherein the step of modifying comprises removing the bellows.

3. The method of claim 1, wherein the pre-modification immersive cooling system has a tube condenser, and, wherein the step of modifying comprises positioning a barrier such that at least some of the substitute operating fluid flows past the barrier to contact the condenser.

4. The method of claim 3, further comprising installing a pump fluidly coupled with one or more fluid conducting passageways configured to pump amounts of the operating fluid that contact the condenser into a bottom 30% of the reservoir.

5. The method of claim 3, further comprising installing a distribution network within the reservoir, and pumping amounts of the operating fluid that contact the condenser into the distribution network.

6. The method of claim 3, further comprising allowing amounts of the fluid that contacts the condenser to flow into a bottom 30% of the reservoir entirely under convective forces.

7. The method of claim 3, further comprising installing a distribution network within the reservoir, and pumping amounts of the operating fluid that contact the condenser into the distribution network.

8. The method of claim 1, wherein the pre-modification immersive cooling system has a condenser, and further comprising removing at least a portion of the tube condenser, and installing at least part of a heat exchanger in a region previously occupied by the removed portion of the tube condenser.

9. The method of claim 8, wherein the heat exchanger comprises a brazed plate heat exchanger.

10. The method of claim 8 further comprising installing at least a portion of a pump in the region previously occupied by the removed portion of the tube condenser, and configuring the pump to cooperate with one or more fluid conducting passageways to pump amounts of the substitute operating fluid from a higher level in the reservoir, through the heat exchanger, and back into a lower level in the reservoir.

11. The method of claim 1, wherein the pre-modification immersive cooling system has a condenser, and wherein the step of modifying comprises (1) removing at least a portion of the tube condenser, (2) utilizing as a hot fluid holding tank, a region previously occupied by the at least portion of the tube condenser, and (3) configuring a pump to pump amounts of the substitute operating fluid from the hot fluid holding tank into a heat exchanger, and then into the reservoir.

12. The method of claim 11, further comprising situating the heat exchanger external to the region previously occupied by the at least portion of the tube condenser.

13. The method of claim 11, wherein the heat exchanger comprises a brazed plate heat exchanger.

14. The method of claim 11, wherein a wall of the hot fluid holding tank at least partially separates a remaining portion of the reservoir from a lumen of the hot fluid holding tank.

15. The method of claim 1, further comprising raising by at least two inches, a height of at least one heat generating component disposed within the reservoir.

16. The method of claim 1, further comprising raising by at least two inches, a height of at least one crypto miner disposed within the reservoir.

* * * * *